US011590853B2

(12) United States Patent
Klein et al.

(10) Patent No.: US 11,590,853 B2
(45) Date of Patent: Feb. 28, 2023

(54) CABLE DRUM FOR SUPPLYING ENERGY TO AN ELECTRICALLY POWERED UTILITY VEHICLE

(71) Applicant: DEERE & COMPANY, Moline, IL (US)

(72) Inventors: Andre Klein, Kaiserslautern (DE); Nicolai Tarasinski, Frankenthal (DE); Simon Pfaffmann, Mannheim (DE); Volker Kegel, Mannheim (DE); Thorsten Koestermeyer, Herford (DE)

(73) Assignee: Deere & Company, Moline, IL (US)

( * ) Notice: Subject to any disclaimer, the term of this patent is extended or adjusted under 35 U.S.C. 154(b) by 107 days.

(21) Appl. No.: 17/197,723

(22) Filed: Mar. 10, 2021

(65) Prior Publication Data

US 2021/0284034 A1 Sep. 16, 2021

(30) Foreign Application Priority Data

Mar. 13, 2020 (DE) .......................... 102020203282.3

(51) Int. Cl.
*B60L 53/18* (2019.01)
*B65H 75/44* (2006.01)
*H02G 11/02* (2006.01)
*H05K 7/20* (2006.01)

(52) U.S. Cl.
CPC .......... *B60L 53/18* (2019.02); *B65H 75/4468* (2013.01); *B65H 75/4478* (2013.01); *H02G 11/02* (2013.01); *H05K 7/20172* (2013.01); *B65H 2701/34* (2013.01)

(58) Field of Classification Search
CPC ............ B65H 75/4428; B65H 75/4468; B65H 2701/34; B60L 53/18; H02G 11/02; H05K 7/20172
See application file for complete search history.

(56) References Cited

U.S. PATENT DOCUMENTS

| 2,330,086 A | 9/1943 | Soffner | |
| 5,235,758 A * | 8/1993 | Leonard | ............... F26B 21/007 34/104 |
| 10,207,589 B2 * | 2/2019 | Guillermin | .......... B65H 75/425 |
| 2019/0074678 A1 | 3/2019 | Kegel et al. | |

FOREIGN PATENT DOCUMENTS

| DE | 765071 C | 5/1954 |
| DE | 102018212150 A1 | 1/2020 |
| JP | S62260512 A | 11/1987 |
| JP | H0231279 U | 2/1990 |

OTHER PUBLICATIONS

Extended European Search Report and Written Opinion issued in European Patent Application No. 21156238.4, dated Jul. 21, 2021, in 07 pages.

\* cited by examiner

*Primary Examiner* — Sang K Kim

(57) ABSTRACT

A cable drum for supplying power to an electrically powered utility vehicle, with an axially running winding body which can be set in rotation about a rotational axis in order to wind up and unwind an electrical cable, wherein on an inside, the winding body carries a plurality of fans which are configured to generate a cooling air stream directed radially outward with respect to a cylindrical drum wall.

3 Claims, 2 Drawing Sheets

CABLE DRUM FOR SUPPLYING ENERGY TO AN ELECTRICALLY POWERED UTILITY VEHICLE

CROSS REFERENCE TO RELATED APPLICATIONS

This application claims priority under 35 U.S.C. § 119 to German patent application DE 10 2020 203 282.3, filed on 13 Mar. 2020, the disclosure of which is incorporated herein by reference.

FIELD OF THE DISCLOSURE

The present disclosure generally relates to an optimized cable drum for supplying power to an electrically powered utility vehicle, and more particularly to a cable drum for supplying power to an electrically powered utility vehicle with an axially running winding body which can be set in rotation about a rotational axis in order to wind up and unwind an electrical cable.

BACKGROUND OF THE DISCLOSURE

A cable drum is known for example from JP S 62 260512, which describes a cable drum delimited by an end-side flange for winding up an extension cable. Depending on the electrical power to be transmitted, because of inductive losses, the wound cable heats up to a greater or lesser extent. In order to counter a possible overheating, on one of the end-side flanges an axial fan is arranged which draws in air from the environment and conveys it in the direction of the interior of the drum body. A plurality of openings distributed in a cylindrical wall of the drum body allows the air to emerge in the direction of the wound cable, whereby the heat losses are conveyed by the generated air stream outwards past the windings via clearances formed by spacer rods.

It is an object of the present disclosure to optimize a cable drum of the type cited initially with respect to the dissipation of loss-induced waste heat in the windings of a cable wound onto the winding body. This object is achieved by means of a cable drum having the features of claim 1.

SUMMARY OF THE DISCLOSURE

The cable drum for supplying power to an electrically powered utility vehicle comprises an axially running winding body which can be set in rotation about a rotational axis in order to wind up and unwind an electrical cable. On an inside, the winding body carries a plurality of fans which are configured to generate a cooling air stream directed radially outward with respect to a cylindrical drum wall. More precisely, by means of the fans, a forced air stream is generated which directly hits the windings of a cable wound onto the winding body, and in this way ensures a particularly efficient dissipation of the loss-induced waste heat generated therein.

The fans may be configured as electrically powered axial fans, wherein these are supplied with power from the outside via sliding contacts arranged in the region of a rotatable suspension of the winding body.

The electrically powered utility vehicle is for example an agricultural, forestry or construction machine which performs an associated work process on a defined area. Merely as an example, this could be plowing a field by means of an agricultural tractor, a harvesting process performed by means of a combine harvester or wood harvester, dredging work by means of a shovel loader in a gravel pit, and similar.

Advantageous refinements of the cable drum according to the invention arise from the subclaims.

Preferably, the fans are arranged in rows along the rotational axis of the winding body. In addition, it is possible that several rows of fans are distributed along an inner circumference of the cylindrical drum wall. In this way, the windings of a cable wound onto the winding body can be exposed to the cooling air stream over a broad area. This may reliably counter the occurrence of undesirable local heat spots within the windings of the cable. The fans are in particular arranged such that their air outlet direction points radially outward with respect to the cylindrical drum wall.

Furthermore, it is conceivable that the fans are attached to the inside of the winding body by means of a carrier plate, wherein the cooling air stream is conducted to a respective air outlet opening in the cylindrical drum wall via an air guide running between the carrier plate and the inside. In particular, in such a case it is possible to divide the cooling air stream generated by an individual fan over several adjacent air outlet openings. The carrier plate and air guide may be produced for example as an integral plastic injection-molding. The assembly thus formed is then connected air-tightly to the cylindrical drum wall on the inside of the winding body.

In order to allow as unhindered a dissipation of the waste heat as possible, in the region of the outlet opening, a separating means is provided, by means of which adjacent windings of a cable wound onto the winding body are held spaced apart in layers in order to form an air passage region.

The separating means may be implemented in widely varying fashions. Thus it is possible that this comprises rods arranged along an outer circumference of the winding body and/or a protrusion running along an outer circumference of the winding body. Preferably, the rods consist of steel with a plastic coating applied to protect the cable. The protrusion may however be configured in the form of a helical ridge. This may be molded integrally onto the cylindrical drum wall of the winding body.

In order to simplify construction of the cable drum, for cost reasons a separating means may also be omitted. The individual windings of the cable wound onto the winding body then lie to a greater or lesser extent against each other, wherein the cooling air stream passes through any gaps formed (by chance) in between.

The cable drum according to the invention for supplying energy to an electrically powered utility vehicle is explained in more detail below with reference to the attached drawings. Corresponding components or those with comparable function carry the same reference numerals.

Other features and aspects will become apparent by consideration of the detailed description and accompanying drawings.

Before any embodiments are explained in detail, it is to be understood that the disclosure is not limited in its application to the details of construction and the arrangement of components set forth in the following description or illustrated in the following drawings. The disclosure is capable of other embodiments and of being practiced or of being carried out in various ways. Further embodiments of the invention may include any combination of features from one or more dependent claims, and such features may be incorporated, collectively or separately, into any independent claim.

DETAILED DESCRIPTION

Figure 1:
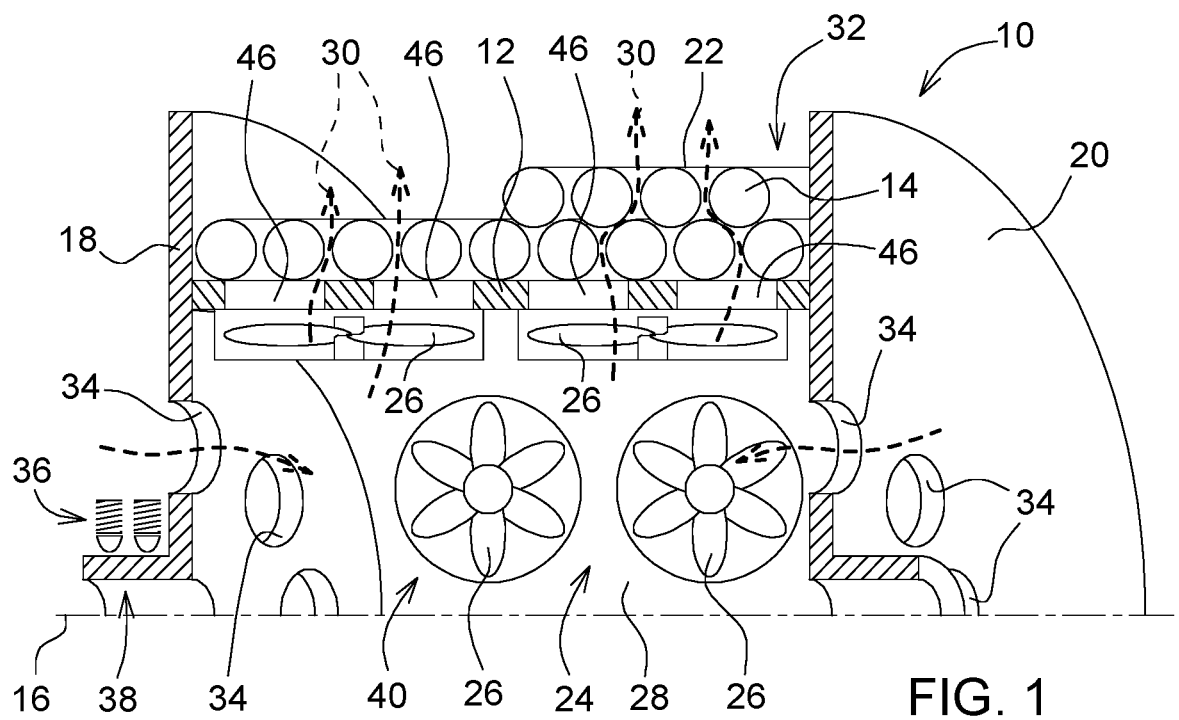
FIG. 1 is a perspective view of an exemplary embodiment of the cable drum according to the disclosure.

FIG. 1 shows a perspective view of an exemplary embodiment of the cable drum according to the disclosure for supplying energy to an electrically powered utility vehicle. In particular, the cable drum is part of an arrangement as described in DE 10 2018 212 150 A1 for the case of a utility vehicle configured as a field chopper.

The cable drum 10 comprises an axially running winding body 12 which can be set in rotation about a rotational axis 16 in order to wind up and unwind an electrical cable 14. For this, the winding body 12 is connected to an electric motor drive (not shown) of the utility vehicle. Left and right terminating flanges 18, 20 form the axial limit of the winding body 12.

The cable 14 serves primarily to supply power to the utility vehicle and comprises a plurality of individual cores consisting of copper, which run mutually insulated in a protective outer sheathing 22. In addition, the cable 14 may serve for electrical and/or optical data transmission. In such a case, the cable 14 comprises further cores in the form of corresponding data and/or control lines. Optical data transmission takes place by means of plastic-sheathed waveguides.

As evident from FIG. 1, on an inside 24, the winding body 12 carries a plurality of fans 26 which are configured to generate a cooling air stream 30 directed radially outward with respect to a cylindrical drum wall 28. More precisely, the fans 26 generate a forced air stream which directly hits the windings 32 of the cable 14 wound onto the winding body 12. Openings 34 formed on the left and right terminating flanges 18, 20 allow air to be drawn in from the environment.

The fans 26 are in the present case electrically driven axial fans, wherein these are supplied with power from the outside via sliding contacts 36 arranged in the region of a rotatable suspension 38 of the winding body 12.

For example, the fans 26 are arranged in rows along the rotational axis 16 of the winding body 12. Several rows of fans 26 are distributed along an inner circumference 40 of the cylindrical drum wall 28. In this way, the windings 32 of a cable 14 wound onto the winding body 12 can be exposed to the cooling air stream 30 over a broad area. The fans 26 are in particular arranged such that their air outlet direction points radially outward with respect to the cylindrical drum wall 28.

Figure 2:
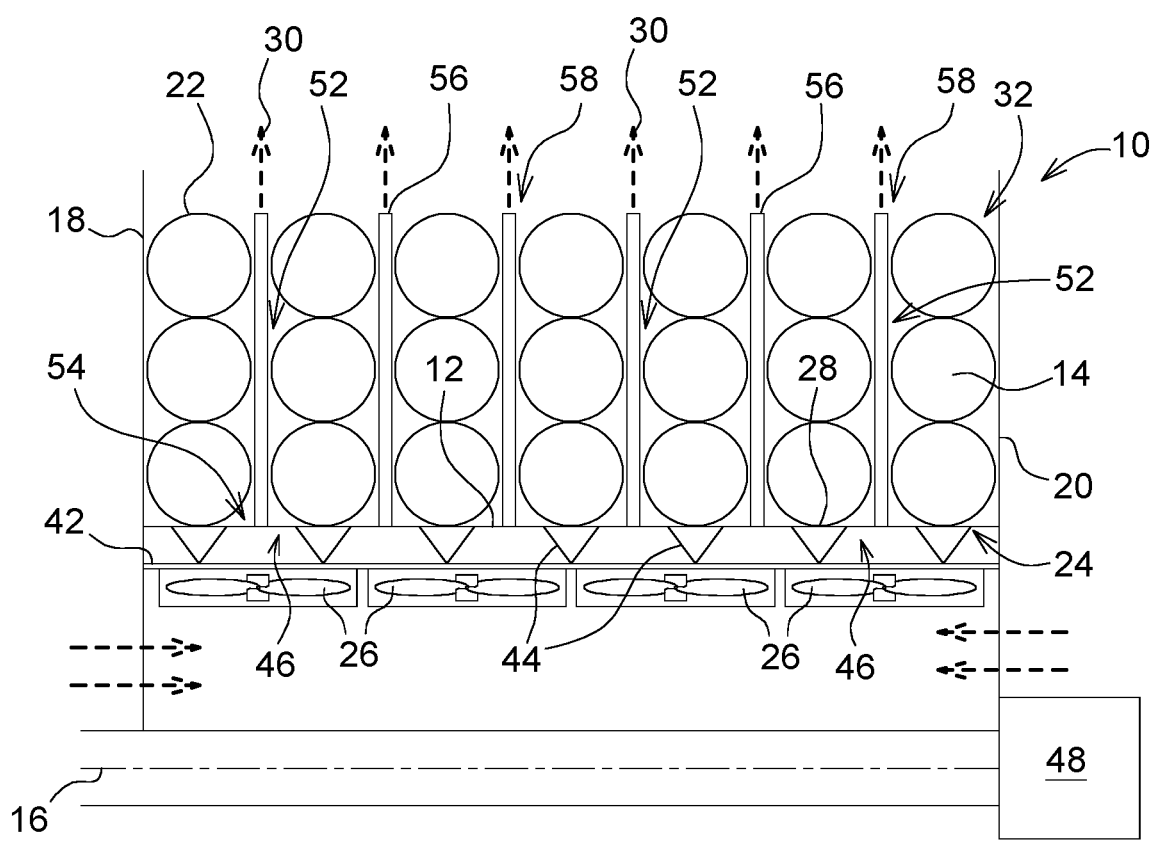
FIG. 2 is a sectional depiction of the cable drum shown in FIG. 1 with a separating means according to a first embodiment.
Figure 3:
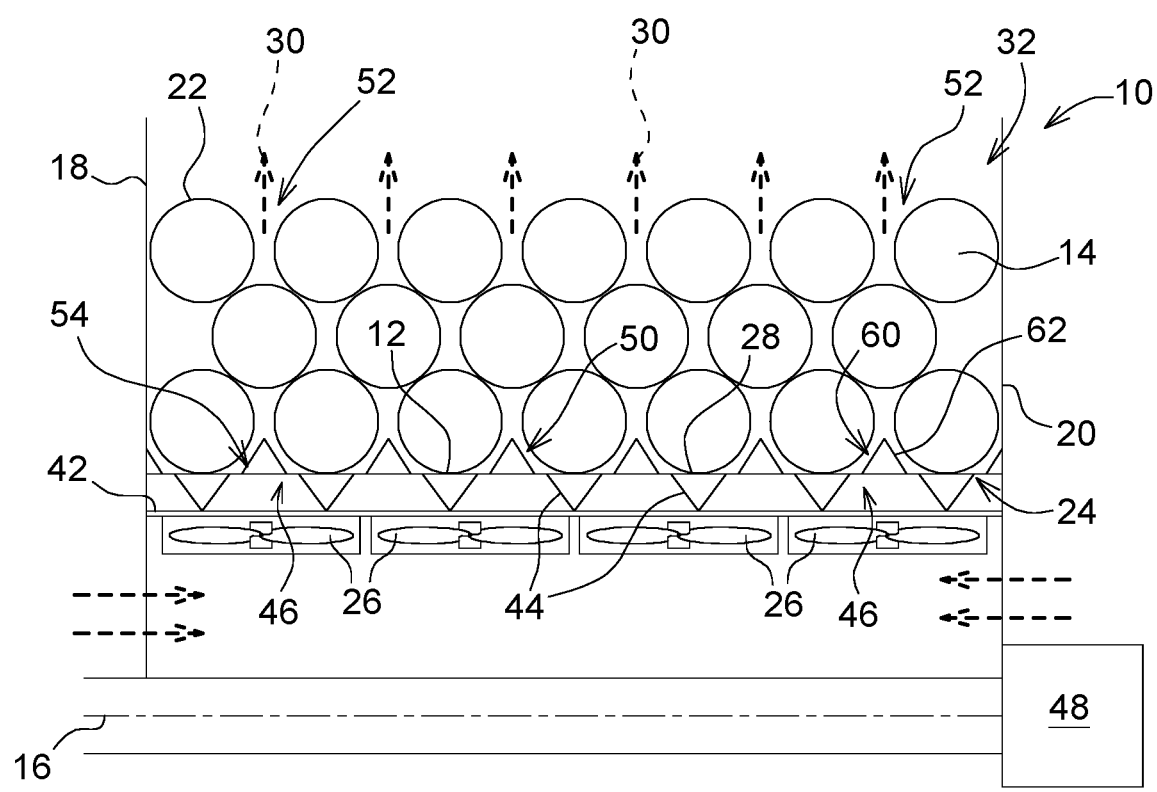
FIG. 3 is a sectional depiction of the cable drum shown in FIG. 1 with a separating means according to a second embodiment.

According to FIG. 2 and FIG. 3, the fans 26 are attached to the inside 24 of the winding body 12 by means of a carrier plate 42, wherein the cooling air stream 30 is conducted to a respective air outlet opening 46 in the drum wall 28 via an air guide 44 running between the carrier plate 42 and the inside 24. Thus the cooling air stream 30 generated by means of a single fan 26 is divided over several adjacent air outlet openings 46. The carrier plate 42 and air guide 44 may be produced for example as an integral plastic injection-molding. The assembly thus formed is then connected air-tightly to the cylindrical drum wall 28 on the inside 24 of the winding body 12.

The rotation speed of the fans 26 is adapted according to the degree of winding of the cable drum 10. Thus the amount of waste heat to be dissipated naturally diminishes with a decreasing number of superposed cable layers. The cable length unwound or that remaining on the winding body 12 is determined by means of a rotary encoder 48 connected to the rotational axis 16. For this, the number of revolutions detected by the rotational encoder 48 and the direction of rotation of the winding body 12 are evaluated. In addition, the electrical power transmitted via the cable 14 is taken into account on the basis of measurement of current intensity by sensors. The rotation speed of the fans 26, and hence the amount of air supplied, is reduced with a decreasing number of cable layers or diminishing current intensity.

In order to allow as unhindered a dissipation of the waste heat as possible, in the region of each of the outlet openings 46, a separating means 50 is arranged by means of which adjacent windings 32 of a cable 14 wound onto the winding body 12 are held spaced apart in layers in order to form an air passage region 52.

The separating means 50 may be implemented in widely varying fashions. Possible embodiments are shown in FIG. 2 and FIG. 3.

In the case of a first embodiment of the separating means 50 shown in FIG. 2, this comprises rods 56 arranged along an outer circumference 54 of the winding body 12. The rods 56 consist of steel with a plastic coating applied to protect the cable 14.

The air outlet openings 46 are situated below a respective clearance 58 formed by the rods 56. The emerging cooling air stream 30 may thus pass unhindered along the windings 32 of the cable 14 wound onto the winding body 12, and thus carry the accumulated waste heat towards the outside.

Alternatively, in the case of a second embodiment of the separating means 50 shown in FIG. 3, this comprises a protrusion 60 running along an outer circumference 54 of the winding body 12. The protrusion 60 takes the form of a helical ridge 62 which is molded integrally onto the drum wall 28 of the winding body 12. The ridge 62 is interrupted in the region of the air outlet openings 46 so as not to hinder a passage of the cooling air stream 30.

Various features are set forth in the following claims.

What is claimed is:

1. A cable drum for supplying power to an electrically powered utility vehicle, with an axially running winding body which can be set in rotation about a rotational axis in order to wind up and unwind an electrical cable, wherein on an inside, the winding body carries a plurality of fans which are configured to generate a cooling air stream directed radially outward with respect to a cylindrical drum wall, wherein the fans are attached to the inside of the winding body by means of a carrier plate, wherein the cooling air stream is conducted to a respective air outlet opening in the cylindrical drum wall via an air guide running between the carrier plate and the inside.

2. The cable drum as claimed in claim 1, wherein in the region of the outlet opening, a separating means is provided, by means of which adjacent windings of a cable wound onto the winding body are held spaced apart in layers in order to form an air passage region.

3. The cable drum as claimed in claim 2, wherein the separating means comprises rods arranged along an outer circumference of the winding body and/or a protrusion running along an outer circumference of the winding body.

* * * * *